US009099820B2

(12) United States Patent
Beer

(10) Patent No.: US 9,099,820 B2
(45) Date of Patent: Aug. 4, 2015

(54) ELECTRONICS MODULE WITH A SIDE ENTRY CONNECTION

(71) Applicant: DELPHI TECHNOLOGIES, INC., Troy, MI (US)

(72) Inventor: Robert C. Beer, Noblesville, IN (US)

(73) Assignee: Delphi Technologies, Inc., Troy, MI (US)

( * ) Notice: Subject to any disclaimer, the term of this patent is extended or adjusted under 35 U.S.C. 154(b) by 52 days.

(21) Appl. No.: 14/030,671

(22) Filed: Sep. 18, 2013

(65) Prior Publication Data

US 2015/0079813 A1  Mar. 19, 2015

(51) Int. Cl.
*H01R 12/71* (2011.01)
*H05K 5/00* (2006.01)

(52) U.S. Cl.
CPC ............ *H01R 12/712* (2013.01); *H05K 5/0069* (2013.01)

(58) Field of Classification Search
CPC .. H01R 23/725; H01R 9/091; H01R 23/7073; H01R 23/7068; H01R 13/6658; H01R 23/025
USPC ............................................ 439/78, 79, 76.1
See application file for complete search history.

(56) References Cited

U.S. PATENT DOCUMENTS

| 4,686,607 | A | * | 8/1987 | Johnson | 361/788 |
| 4,836,791 | A | * | 6/1989 | Grabbe et al. | 439/79 |
| 5,066,236 | A | * | 11/1991 | Broeksteeg | 439/79 |
| 5,263,880 | A |   | 11/1993 | Schwarz et al. | |
| 5,609,491 | A |   | 3/1997 | Cooper et al. | |
| 5,688,130 | A | * | 11/1997 | Huang | 439/79 |
| 6,056,559 | A | * | 5/2000 | Olson | 439/108 |
| 6,666,692 | B2 | * | 12/2003 | Billman et al. | 439/76.1 |
| 6,709,298 | B2 | * | 3/2004 | Bradley | 439/701 |
| 7,270,551 | B2 | * | 9/2007 | Busse et al. | 439/76.1 |
| 7,621,760 | B1 | * | 11/2009 | Barr et al. | 439/79 |
| 2001/0012730 | A1 | * | 8/2001 | Ramey et al. | 439/608 |
| 2008/0261417 | A1 | * | 10/2008 | Minich | 439/79 |
| 2013/0303003 | A1 | * | 11/2013 | Tsang et al. | 439/74 |

FOREIGN PATENT DOCUMENTS

EP    0 565 653 A1   10/1993
WO    93/09656 A1   5/1993

OTHER PUBLICATIONS

European Search Report dated Feb. 18, 2015.

* cited by examiner

*Primary Examiner* — Gary Paumen
(74) *Attorney, Agent, or Firm* — Lawrence D. Hazelton

(57) ABSTRACT

An electronics module that includes a printed circuit board (PCB), a connector, a housing with a shroud, and an interposer. The PCB defines a plane of the PCB. The connector is coupled to the PCB to form a circuit board assembly (CBA). The connector includes a plurality of header pins oriented perpendicular to the plane. The housing is configured to receive the CBA. The housing is configured to define an opening in a wall of the housing proximate to the connector when the CBA is installed. The wall is characterized as perpendicular to the plane. The interposer is configured to couple to the housing. The interposer includes a plurality of mating pins oriented parallel to the plane. Each of the mating pins defines a forked end configured to make electrical contact with each of the header pins when the interposer is inserted into the opening.

4 Claims, 4 Drawing Sheets

ELECTRONICS MODULE WITH A SIDE ENTRY CONNECTION

TECHNICAL FIELD OF INVENTION

This disclosure generally relates to an electronics module, and more particularly relates an interposer configured to connect with a connector coupled to a printed circuit board (PCB) to form a right angle connection to the PCB.

BACKGROUND OF INVENTION

It is known to form an electronics module by placing a circuit board assembly (CBA) into an enclosure or housing to protect the CBA from impact and contamination related damage. Preferably, the electronics module is assembled using vertical assembly techniques. That is, the electronics module is assembled by placing the various parts that form the module using only vertical motions to stack the parts, as opposed to having to reorient, for example, the housing to perform a particular assembly step. However, limiting the manufacturing techniques to only vertical assembly techniques may be undesirable if a sideways connection to the electronics module is desired. Right angle header connectors that use bent pins to transition from the plane of the circuit board to a sideways connection, and so can comply with vertical assembly techniques, have been proposed. However, these kinds of header connectors cannot readily be mated to standard mating harness connectors due to the proximity of the terminal contact area with respect to the mechanical retention and seal features. A mating connector design would need to intrude into the electronics module further than is desired, creating a longer, larger non-standard mating connection system.

SUMMARY OF THE INVENTION

In accordance with one embodiment, an electronics module is provided. The module includes a printed circuit board (PCB), a connector, a housing, and an interposer. The PCB defines a plane of the PCB. The connector is coupled to the PCB to form a circuit board assembly (CBA). The connector includes a plurality of header pins oriented perpendicular to the plane. The housing is configured to receive the CBA. The housing is configured to define an opening in a wall of the housing proximate to the connector when the CBA is installed. The wall is characterized as perpendicular to the plane. The interposer is configured to couple to the housing. The interposer includes a plurality of mating pins oriented parallel to the plane. Each of the mating pins defines a forked end configured to make electrical contact with each of the header pins when the interposer is inserted into the opening.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
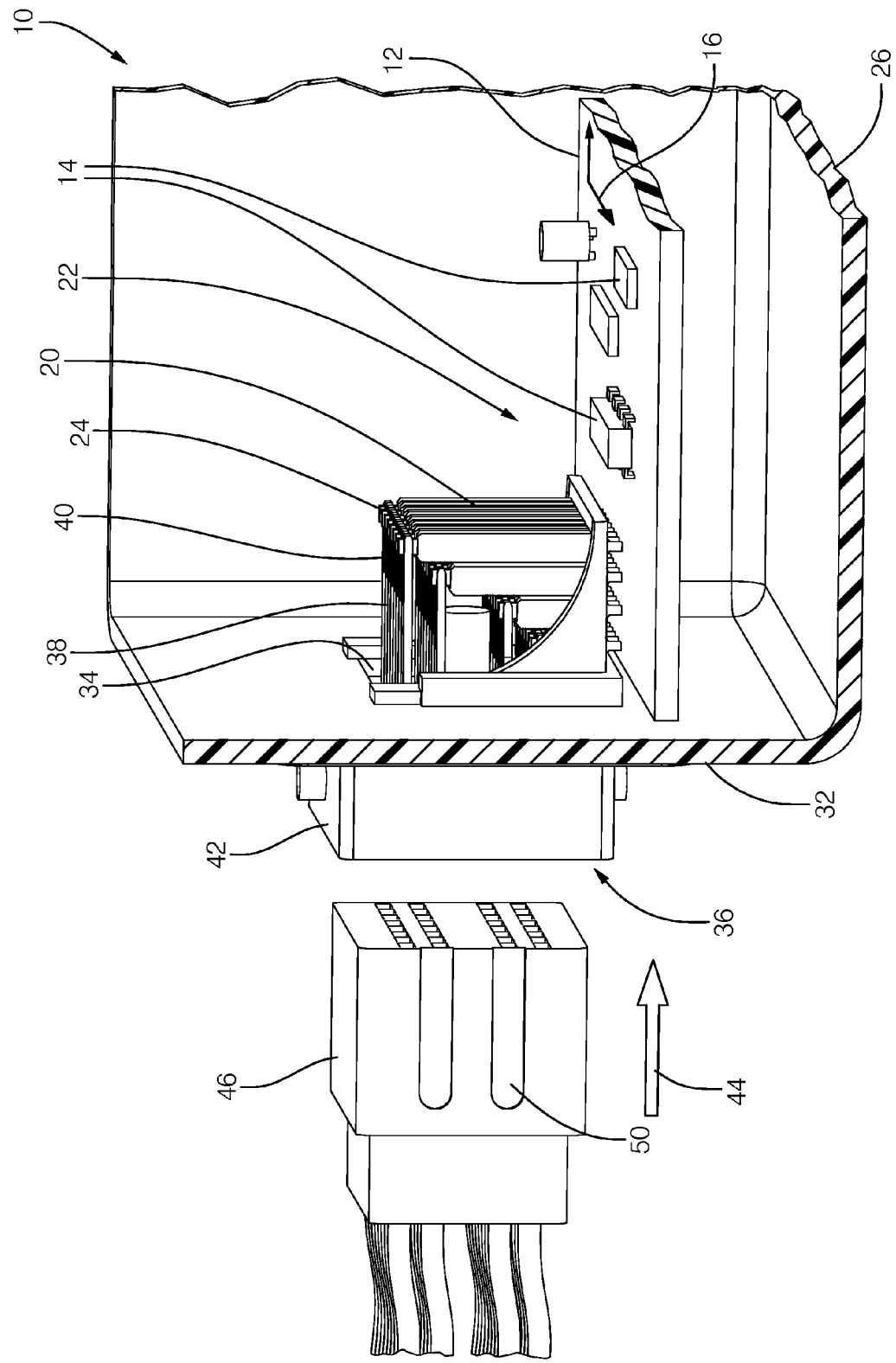
FIG. 1 is a sectional cut-away perspective view of an electronics module in accordance with one embodiment.
Figure 2:
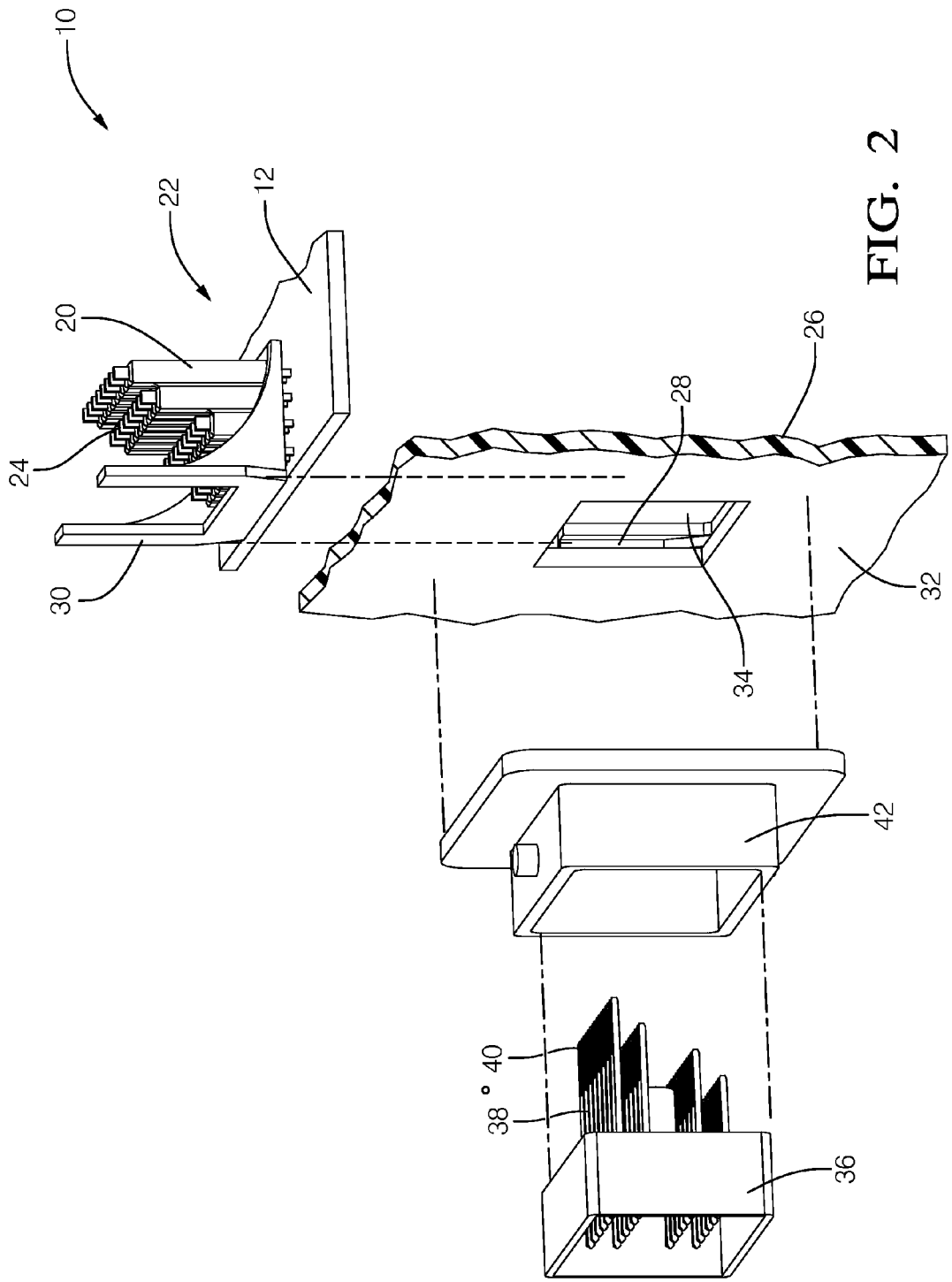
FIG. 2 is an exploded cut-away perspective view of portions of the electronics module of FIG. 1 in accordance with one embodiment.
Figure 3:
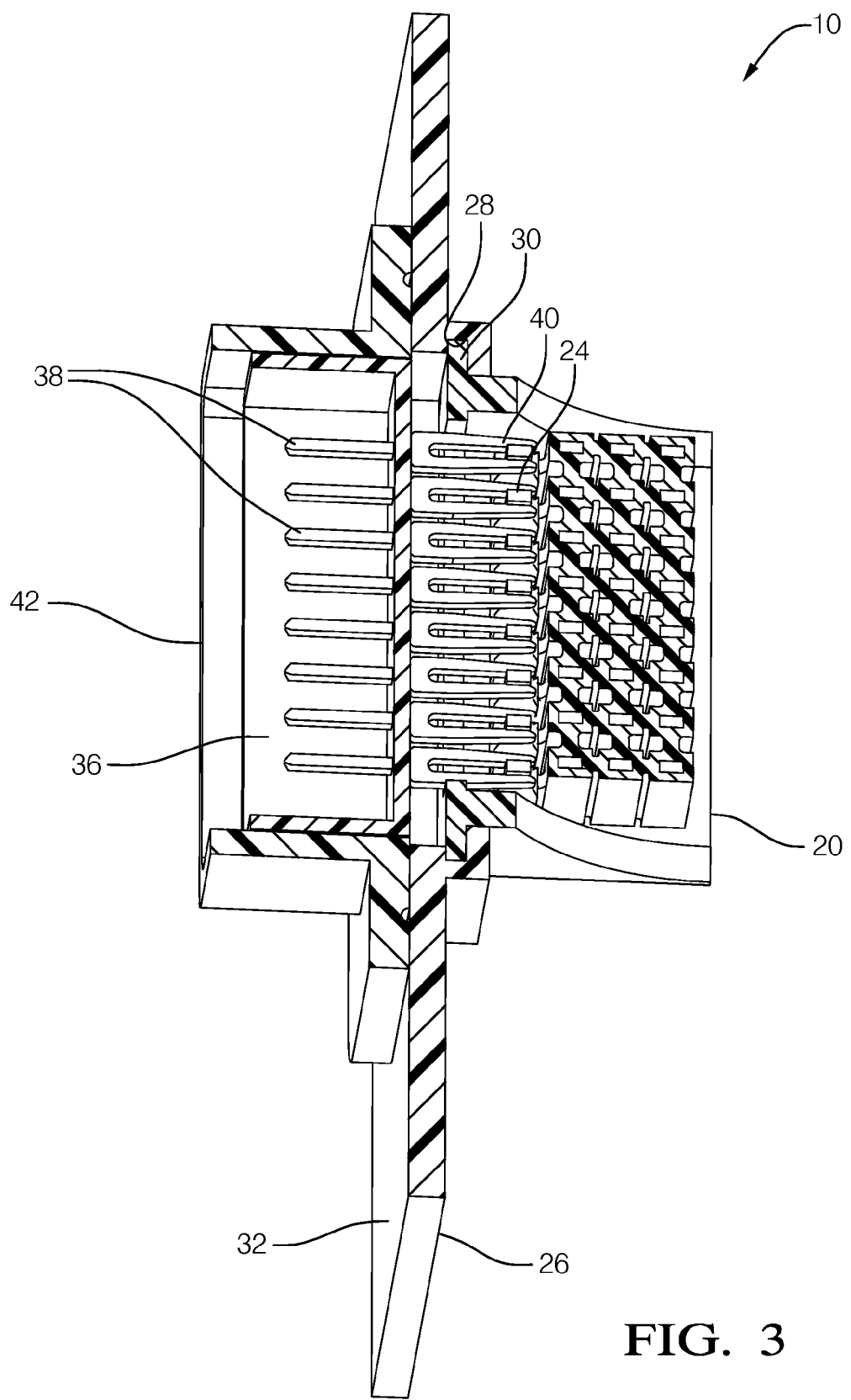
FIG. 3 is a sectional perspective view of portions the electronics module of FIG. 1 in accordance with one embodiment.

FIGS. 1-3 illustrate a non-limiting example of an electronics module, hereafter often referred to as the module 10. The module 10 includes a printed circuit board (PCB), hereafter often referred to as the PCB 12. The PCB may be formed of known materials such as FR-4 circuit board material. There may be one or more electrical components 14 attached to the PCB 12 such as, but not limited to, an integrated circuit and/or a capacitor. Typically, the PCB 12 is relatively flat, so the PCB 12 can be used to define a plane 16 of the PCB 12.

The module 10 includes a connector 20 coupled to the (PCB) to form a circuit board assembly (CBA), hereafter often referred to as the CBA 22. In order to facilitate vertical assembly techniques, the connector 20 includes a plurality of header pins 24 characterized as being relatively strait (i.e. not bent at a right angle) and oriented perpendicular to the plane 16 of the PCB 12. Such an arrangement makes fabricating the connector 20 easy and relatively low cost as the connector 20 can be formed using a single pull direction molding die, as will be recognized by those skilled in the molding arts.

The module 10 includes a housing 26 configured to receive the CBA 22. The housing 26 may define a retaining feature such as a slot 28 configured to cooperate with an engaging feature such as a tab 30 of the connector 20 to position or secure the connector 20 to a wall 32 of the housing 26 when the CBA 22 is placed into the housing 26. This retaining feature transfers the mechanical insertion load to the housing wall when an interposer 36 (FIG. 2) is connected to the module 10. The non-limiting example illustrates how the orientation of the slot 28 and the tab 30 further enable or facilitate the desired vertical assembly technique.

The housing 26 may be further configured to define an opening 34 in the wall 32 of the housing 26 that is proximate to the connector 20 when or after the CBA 22 is installed into the housing 26 as part of assembling the module 10. In this example, the wall 32 is characterized as perpendicular to the plane 16 of the PCB 12. By defining the opening 34 with this orientation relative to the PCB 12, the module 10 is able to provide a side entry connection or sideways connection to the module 10.

To this end, the module 10 may include an interposer 36 (FIG. 2) configured to couple to the housing 26 in a manner that will be explained in more detail below. The interposer 36 includes a plurality of mating pins 38 that are substantially straight and oriented parallel to the plane 16 of the PCB 12. Preferably, each of the mating pins 38 includes or defines a forked end 40 (FIG. 3) configured to make electrical contact with one each or more of the header pins 24. If a high current connection is needed, greater than ten Amperes (10 A) for example, then multiple mating pins 38 may be formed to be shorted together so that multiples of the forked end 40 are shorted together so the current load is shared by more than one of the connections formed when the forked end is pressed over or onto the header pins 24 when the interposer 36 is inserted into the opening 34.

The module 10 may also include a shroud 42 attached to the wall 32 of the housing 26 adjacent the opening 34. The shroud 42 may be glued or welded (metal or plastic welding) to the housing 26, depending on the material used to form the shroud 42 and the housing 26. Alternatively, the housing may be configured to define the shroud 42. That is, the shroud 42 and the housing 26 may be formed integrally as a unitary part.

The shroud 42 is generally configured to receive the interposer 36 so the forked end 40 of the mating pins 38 can form an electrical connection with the header pins 24. The shroud 42 may also be configured to cooperate with a mating plug 46 to seal the opening and/or seal the contact between the mating plug 46 and the interposer 36 when the mating plug 46 is connected to or inserted into the interposer 36 in the direction shown by arrow 44. In order to improve sealing, the mating plug 46, the shroud 42, and/or the interposer 36 may include a compressible seal (not shown). Suitable designs and materials to form the compressible seal are well known in the connector sealing arts.

The interposer 36 and or the shroud 42 may include features (not shown) that cooperate with a keyway 50 on the mating plug 46 so that proper orientation is assured when the mating plug is inserted into the interposer 36 and/or shroud 42. The features that cooperate with the keyway 50 may also be useful to distinguish modules that have essentially the same electronics and general function, but differ because software in the module 10 is unique for a particular application, for a particular model of vehicle for example.

The body portion (portion other than the header pins) of the connector 20, the body portion (portion other than the mating pins) of the interposer 36 and the shroud 42 may all be suitably formed of a polymeric compound with performance characteristics suitable for the application environment of the module 10. It may be preferable to form the housing 26 of cast aluminum if it is necessary to dissipate a relatively large amount of power, more than ten Watts (10 W) for example. Furthermore, an aluminum housing can form a Faraday cage to protect a circuit on the PCB 12 from electromagnetic interference. Otherwise, the housing 26 may be formed of the same polymeric compound used for the parts listed above. The header pins 24 and the mating pins may be formed of copper alloy, optional plated with nickel or tin to improve corrosion resistance, as will be recognized by those in the art. Alternatively, the mating pins 38, particularly the forked end 40 may be formed of a material with improved spring characteristics such as a beryllium-copper alloy.

Figure 4:
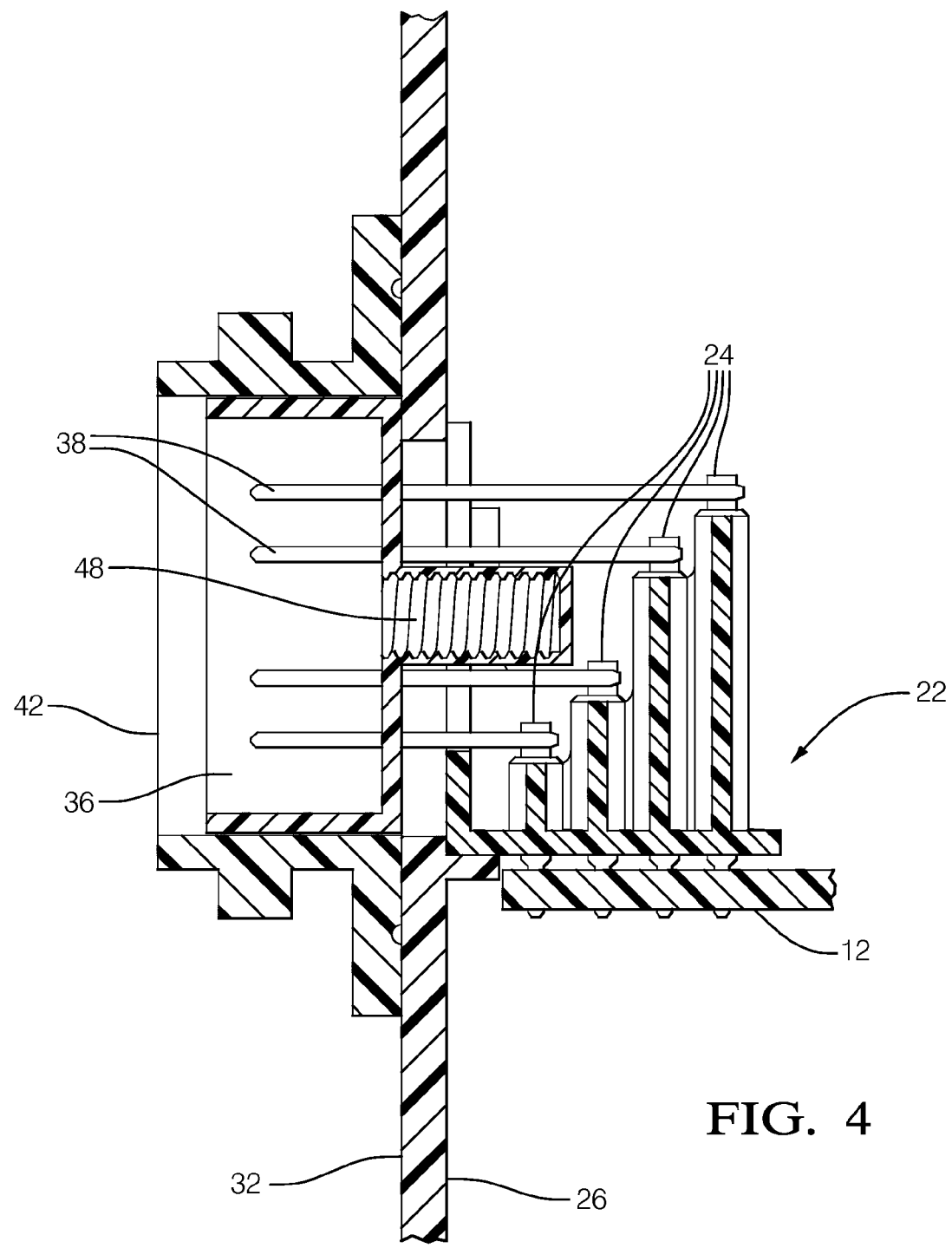
FIG. 4 is a sectional side view of portions the electronics module of FIG. 1 in accordance with one embodiment.

FIG. 4 further illustrates a non-limiting example of the module 10, in particular a feature of the interposer 36. The sectional view illustrates a threaded area 48 configured to assist with removing the interposer 36 from the module thereby breaking the electrical connection to the CBA 12. Having the interposer 36 configured to be removable and replaceable may be advantageous for servicing the module 10, for example replacing the interposer 36 if the mating pins are damaged, or modifying the module for connecting to a mating plug 46 with a different configuration of the keyway 50 because, for example, the software of the module 10 has been changed.

Accordingly, an electronics module (the module 10) is provided. The features described herein, in particular the cooperation between the interposer 36 and the connector 20, allow for the module 10 to advantageously assembled using vertical assembly techniques. Furthermore, having an interposer 36 that is replaceable provides for a way to service a feature of the module 10 that is sometimes easily damaged, for example bent mating pins. In addition, installing the interposer 36 may be deferred until the very last step of assembling the module 10. This may be advantageous for instances where the only difference among various modules is software, and/or the configuration features that cooperate with the keyway 50 of a mating connector. As such, modules may be assembled except for installing the interposer, stockpiled, and then later finished by programming and/or installing the proper configuration of the interposer 36.

While this invention has been described in terms of the preferred embodiments thereof, it is not intended to be so limited, but rather only to the extent set forth in the claims that follow.

I claim:
1. An electronics module comprising:
   a printed circuit board (PCB), wherein the PCB defines a plane of the PCB;
   a connector coupled to the PCB to form a circuit board assembly (CBA), wherein the connector includes a plurality of header pins oriented perpendicular to the plane;
   a housing configured to receive the CBA, said housing configured to define an opening in a wall of the housing proximate to the connector when the CBA is installed, wherein the wall is characterized as perpendicular to the plane; and
   an interposer configured to couple to the housing, wherein the interposer includes a plurality of mating pins oriented parallel to the plane, wherein each of the mating pins defines a forked end configured to make electrical contact with each of the header pins when the interposer is inserted into the opening.

2. The electronics module in accordance with claim 1, wherein the housing includes a shroud attached to the wall adjacent the opening, said shroud configured to receive the interposer and cooperate with a mating plug to seal the opening when the mating plug is connected to the interposer.

3. The electronics module in accordance with claim 1, wherein the housing defines a shroud adjacent the opening, said shroud configured to receive the interposer and cooperate with a mating plug to seal the opening when the mating plug is connected to the interposer.

4. The electronics module in accordance with claim 1, wherein the interposer includes a threaded area configured for removing the interposer from the CBA.

* * * * *